United States Patent [19]
Randon et al.

[11] 4,131,697
[45] Dec. 26, 1978

[54] METHOD OF COATING CARBON FILAMENTS WITH SILICON CARBIDE

[75] Inventors: Jean-Louis R. G. Randon, Brettigny-sur-Orge; Georges S. Slama, Creteil, both of France

[73] Assignee: Association pour la Recherches et le Developpement des Methodes et Processus Industriels, France

[21] Appl. No.: 832,611

[22] Filed: Sep. 12, 1977

Related U.S. Application Data

[63] Continuation of Ser. No. 479,096, Jun. 13, 1974.

[30] Foreign Application Priority Data

Jun. 15, 1973 [FR] France ............................. 73 21814

[51] Int. Cl.$^2$ ............................................. C23C 11/00
[52] U.S. Cl. ...................................... 427/249; 427/112

[58] Field of Search .................. 427/249, 51, 52, 112, 427/113, 50, 402; 428/368

[56] References Cited

U.S. PATENT DOCUMENTS

| Re. 26,885 | 5/1970 | Harris | 427/113 |
| 876,332 | 1/1908 | Clark | 427/52 |
| 3,459,504 | 8/1969 | Bracken et al. | 427/249 X |

Primary Examiner—Morris Kaplan

[57] ABSTRACT

A coating of silicon carbide is formed on carbon filaments by passing the heated filaments into an atmosphere of hydrogen and silicon tetrachloride to deposit silicon, and then into a silicon carbide-forming atmosphere. Carbon filaments having a coating of silicon carbide up to 0.2 micron or over 10 microns thick are described.

3 Claims, No Drawings

METHOD OF COATING CARBON FILAMENTS WITH SILICON CARBIDE

This is a continuation of application Ser. No. 479,096 filed June 13, 1974. su

The present invention relates to carbon filaments coated with silicon carbide and to a method of making these filaments.

It is known to coat certain carbon surfaces with a layer of silicon carbide. The method employed consists in heating the surface to a temperature between both 1000 and 1150° C and then contacting the surface with a gaseous mixture of a halogenated silane and hydrogen so as to obtain a deposit of silicon of thickness greater than 1 micron. The surface so coated is then brought to a temperature higher than the melting point of silicon, and silicon carbide is deposited thereon at a temperature higher than about 1050° C.

It is also known to coat filaments of certain refractory metals such as tungsten with silicon carbide by passing an electric current through the filament to heat it by the Joule effect, and passing the heated filament through a reactor in which is a mixture consisting of, for example, methyltrichlorosilane and hydrogen.

However, these known methods cannot be used for coating a carbon filament with a layer of silicon carbide. This is either impossible or the products formed have poor inadequate mechanical properties.

We have now devised a method of coating carbon fibres with silicon carbide. In one aspect, the invention provides a method of coating a carbon filament with silicon carbide, which comprises passing the carbon filament heated by the Joule effect to a temperature between 1200 and 1420° C, into a first reactor containing gaseous silicon tetrachloride and hydrogen, the dwell time of the filament in the first reactor being less than 30 seconds, and then passing the filament heated to a temperature of at least 1100° C into a second reactor containing gaseous compounds the reaction of which in contact with the filament leads to the formation of a coating of silicon carbide on the filament.

The invention also includes a carbon filament coated with silicon carbide, the carbon core being of diameter less than about 50 microns and the silicon carbide coating being of thickness less than 0.2 micron. Preferably, such a filament also comprises an outer layer of silicon carbide the thickness of which is at least 10 microns.

In the method of the invention, before forming the relatively thick deposit of silicon carbide, the carbon filament is coated with a very thin, smooth and homogeneous layer (of thickness less than 0.2 micron) of silicon carbide arising from reaction between the deposited silicon and the carbon core, this reaction taking place during the deposition of the silicon.

Without wishing to be bound by this theory, we believe that the first very thin deposit of silicon on the carbon leads to the formation of germs of silicon carbide uniformly distributed over the surface of the graphite which then subsequently enables the homogeneous growth of a relatively thick layer (with a thickness greater than 10 microns, for example) of silicon carbide. It is established, in fact, that the coated filaments obtained have a very smooth outer surface of silicon carbide, which implies good homogeneity in the coating.

Preferably, the coated filaments of the invention comprise a carbon core of diameter less than about 50 microns, an interlayer of silicon carbide of thickness less than 0.2 micron and a surface layer of silicon carbide of thickness greater than about 20 microns.

In order that the invention may be more fully understood, the following Example is given by way of illustration only.

EXAMPLE

A carbon filament 30 microns in diameter was passed into a cylindrical reactor 25 mm in diameter and 100 mm long. The filament was heated by Joule effect to a temperature of 1350° C. Into this reactor was admitted a gaseous mixture containing about 30% by volume silicon tetrachloride and 70% by volume hydrogen. The flow of gaseous mixture was about 1 liter per minute and the speed of the filament passing into the reactor was such as to give it a mean dwell time in the reactor of about 10 seconds.

By this treatment a carbon-filament is obtained whose diameter is very little different from the original. However, under the microscope a change in the colour of the filament can be seen. Also, by X-rays, it can be shown that a very thin deposit of SiC has been formed on the surface. Examination by electron-microscope shows that this deposit of silicon carbide has a thickness distinctly less than 0.2 micron. This product is novel per se. The filament thus obtained was passed into a second reactor 500 mm long and about 25 mm in diameter. The duration of the dwell of the filament in the reactor was about 50 seconds. The filament was heated by Joule effect to a temperature of about 1200° C. The reactor was fed with a gaseous mixture of methyltrichlorosilane and hydrogen, the mixture comprising about 0.34 mole of methyltrichlorosilane per mole of hydrogen. The flow of gaseous mixture into the reactor was about 10 liters per minute. Round the reactor was arranged a furnace in accordance with the description given in French Patent No. 2,170,952.

A monofilament was thus obtained having a core of graphite 30 microns in diameter and a coating of silicon carbide, the overall diameter of the coated filament being about 110 mirons.

The filaments so obtained has a smooth and shiny outer surface, their tensile stength was about 300 h bars on average with a low spread of values.

What is claimed is:

1. A method of coating a carbon filament having a thickness of less than 50 microns with silicon carbide, which comprises passing the carbon filament heated by the Joule effect to a temperature of about 1350° C, into a first reactor containing gaseous silicon tetrachloride and hydrogen, the dwell time of the filament in the first reactor being less than 30 seconds, thereby forming a layer of silicon carbide having a thickness of less than 0.2 micron, and then passing the filament heated to a temperature of at least 1100° C into a second reactor containing methyltrichlorosilane and hydrogen thereby producing a silicon carbide coating on the filament of at least ten microns.

2. A method as claimed in claim 1, wherein the relative proportion of silicon tetrachloride in the hydrogen is about 30% by volume and the dwell time of the filament in the first reactor is of the order of 10 seconds.

3. A method as claimed in claim 1, wherein the temperature in the second reactor is about 1200° C; the walls of the second reactor are heated and the reactor is fed with a mixture containing about 0.34 molar parts of methyltrichlorosilane per mole of hydrogen.

* * * * *

UNITED STATES PATENT OFFICE
CERTIFICATE OF CORRECTION

Patent No. 4,131,697        Dated   December 26, 1978

Inventor(s)  Jean-Louis R. G. Randon

It is certified that error appears in the above-identified patent and that said Letters Patent are hereby corrected as shown below:

[73] Assignees: Association Pour La Recherche Et Le Developpement Des Methodes Et Processus Industriels (A.R.M.I.N.E.S.); Societe Nationale D'etude Et De Construction De Moteurs D'Aviation (S.N.E.C.M.A.); and Societe Nationale Des Poudres Et Explosifs (S.N.P.E.) all of Paris, France Signed and Sealed this Ninth Day of December 1980

|SEAL|

*Attest:*

SIDNEY A. DIAMOND

*Attesting Officer*        *Commissioner of Patents and Trademarks*